(12) United States Patent
Yu et al.

(10) Patent No.: US 7,041,601 B1
(45) Date of Patent: May 9, 2006

(54) METHOD OF MANUFACTURING METAL GATE MOSFET WITH STRAINED CHANNEL

(75) Inventors: Bin Yu, Cupertino, CA (US); Haihong Wang, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 316 days.

(21) Appl. No.: 10/653,103

(22) Filed: Sep. 3, 2003

(51) Int. Cl.
    *H01L 21/311* (2006.01)

(52) U.S. Cl. ............... 438/696; 438/719; 438/720; 438/721

(58) Field of Classification Search ............... 438/696, 438/719, 720, 721
    See application file for complete search history.

(56) References Cited

U.S. PATENT DOCUMENTS

| | | | |
|---|---|---|---|
| 6,353,249 B1 * | 3/2002 | Boyd et al. | 257/369 |
| 6,660,598 B1 * | 12/2003 | Hanafi et al. | 438/291 |
| 6,774,466 B1 * | 8/2004 | Kajiwara et al. | 257/673 |
| 2004/0048424 A1 * | 3/2004 | Wu et al. | 438/154 |

OTHER PUBLICATIONS

Digh Hisamoto et al.: "FinFET—A Self-Aligned Double-Gate MOSFET Scalable to 20 nm," IEEE Transactions on Electron Devices, vol. 47, No. 12, Dec. 2000, pp. 2320-2325.
Yang-Kyu Choi et al.: "Sub-20nm CMOS Fin FET Technologies," 2001, IEEE, IEDM, pp. 421-424.
Xuejue Huang et al.: "Sub-50 nm P-Channel Fin FET," IEEE Transactions on Electron Devices, vol. 48, No. 5, May 2001, pp. 880-886.
Yang-Kyu Choi et al.: "Nanoscale CMOS Spacer FinFET for the Terabit Era," IEEE Electron Device Letters, vol. 23, No. 1, Jan. 2002, pp. 25-27.
Xuejue Huang et al.: "Sub 50-nm FinFET: PMOS," 1999 IEEE, IEDM, pp. 67-70.

* cited by examiner

*Primary Examiner*—Nadine G. Norton
*Assistant Examiner*—Binh X. Tran
(74) *Attorney, Agent, or Firm*—Harrity Snyder LLP

(57) ABSTRACT

A method of manufacturing a MOSFET type semiconductor device includes forming a fin structure and a dummy gate structure over the fin structure. Sidewall spacers may be formed adjacent the dummy gate structure. The dummy gate structure may be later removed and replaced with a metal layer that is formed at a high temperature (e.g., 600°–700° C.). The cooling of the metal layer induces strain to the fin structure that affects the mobility of the double-gate MOSFET.

20 Claims, 10 Drawing Sheets

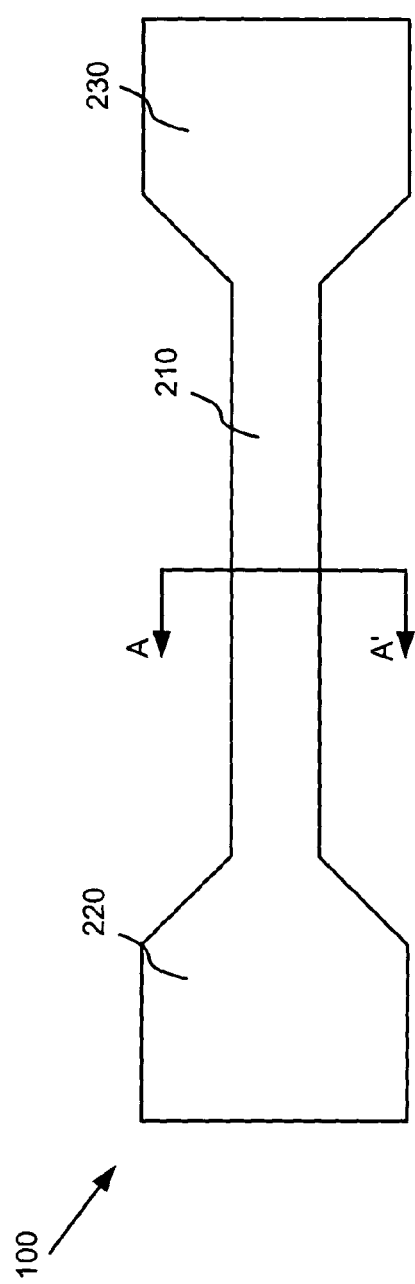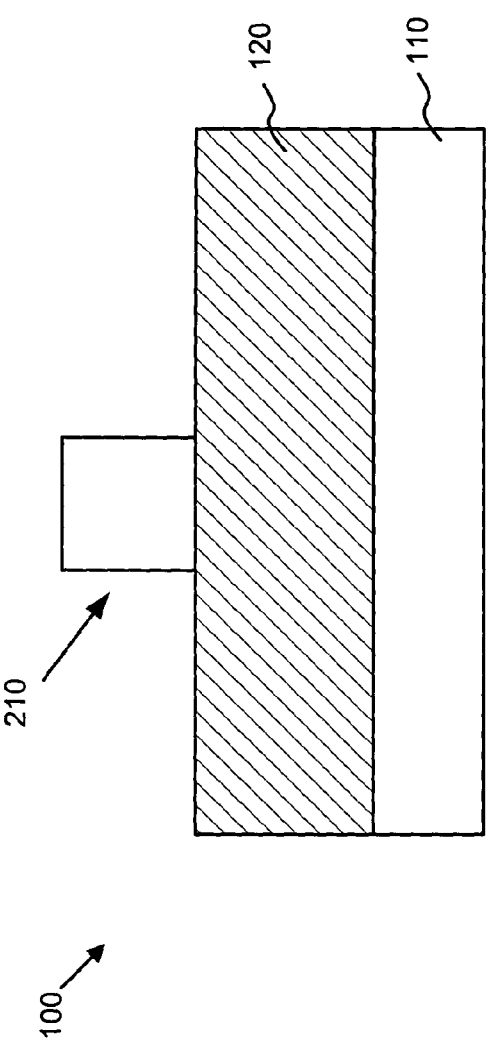

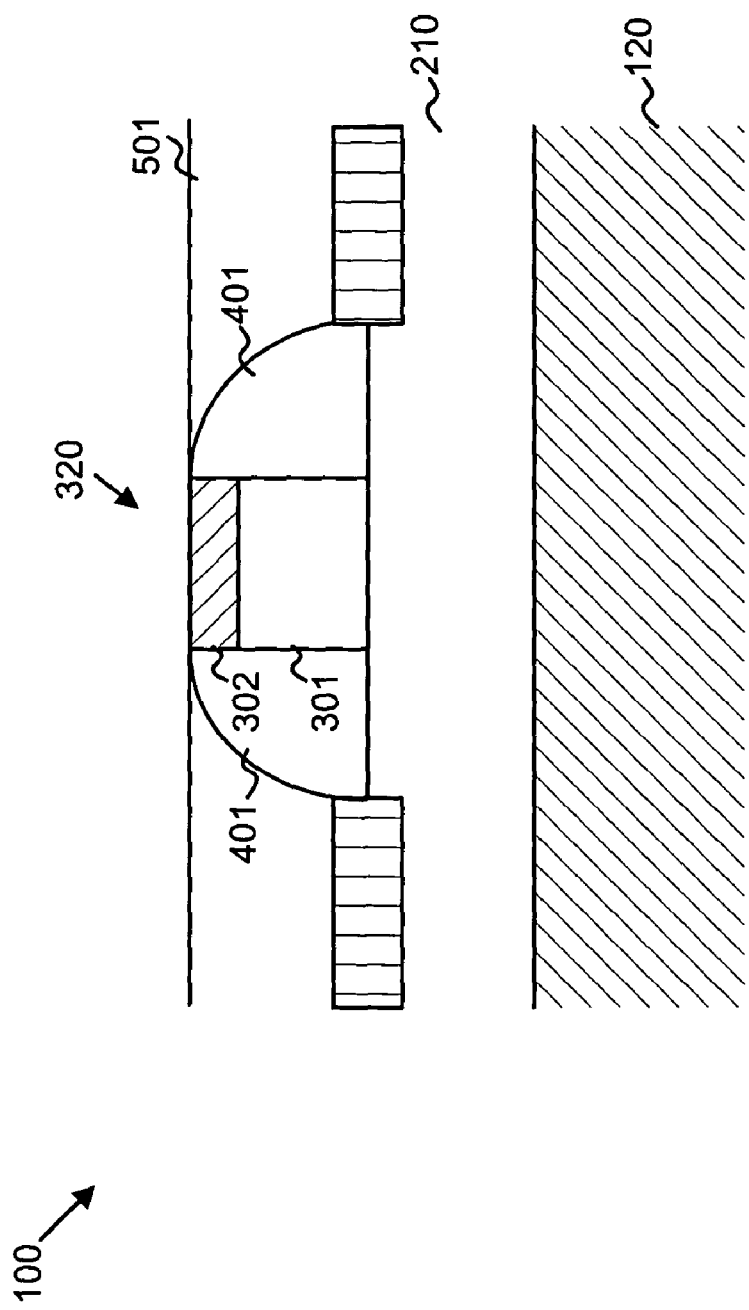

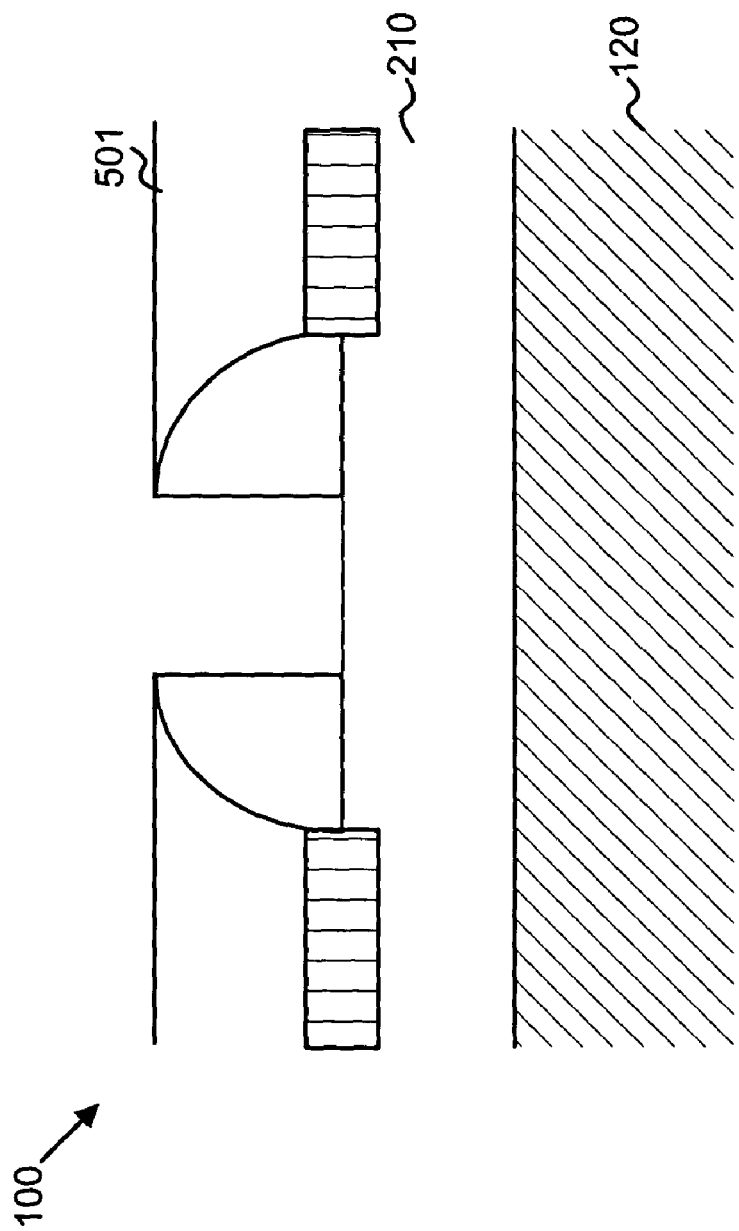

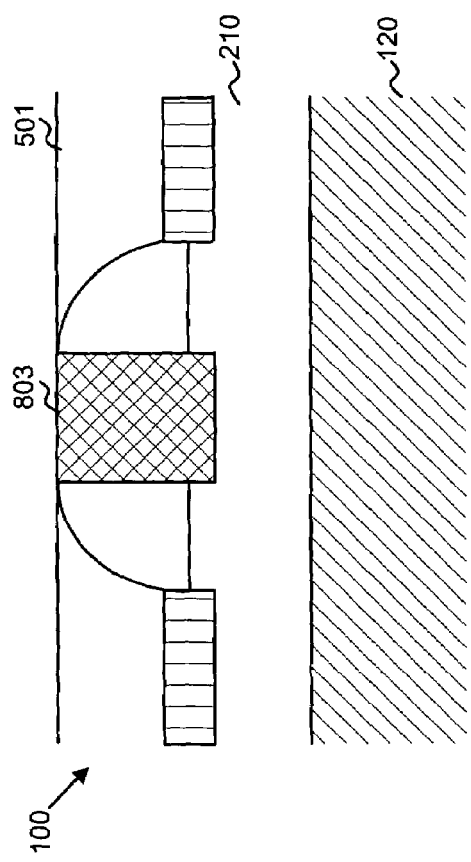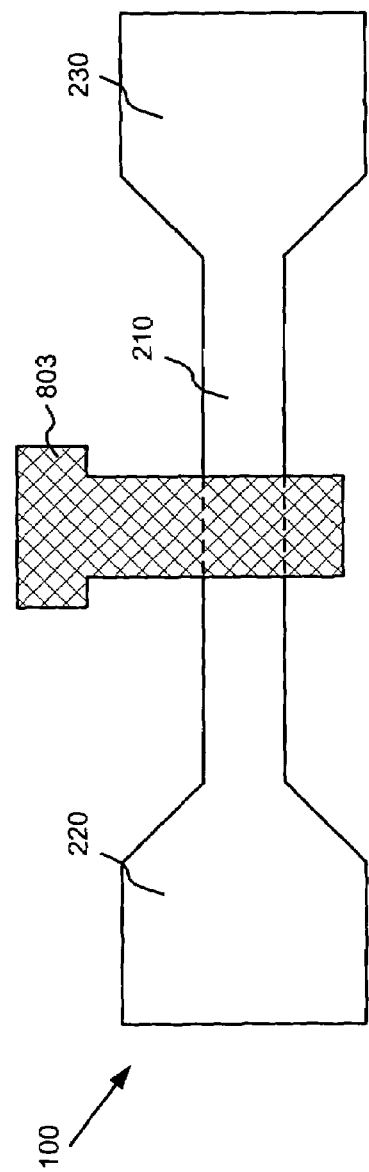

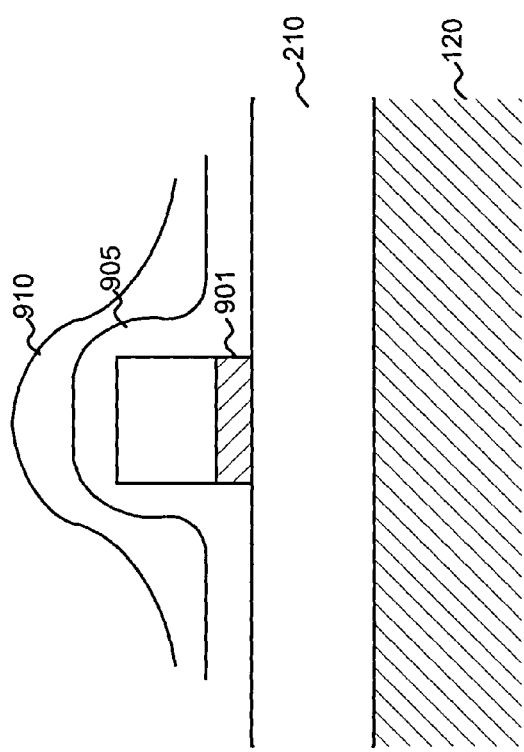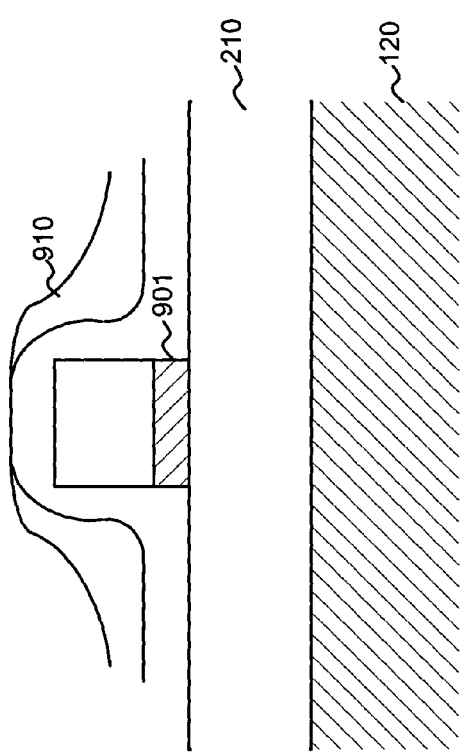

METHOD OF MANUFACTURING METAL GATE MOSFET WITH STRAINED CHANNEL

TECHNICAL FIELD

The present invention relates to semiconductor devices and methods of manufacturing semiconductor devices. The present invention has particular applicability to double-gate devices.

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In several respects, the double-gate MOSFETs offer better characteristics than the conventional bulk silicon MOSFETs. These improvements arise because the double-gate MOSFET has a gate electrode on both sides of the channel, rather than on only one side as in conventional MOSFETs. When there are two gates, the electric field generated by the drain is better screened from the source end of the channel. Also, two gates can control roughly twice as much current as a single gate, resulting in a stronger switching signal.

A FinFET is a double-gate structure that exhibits good short channel behavior. A FinFET includes a channel formed in a vertical fin. The FinFET structure may be fabricated using layout and process techniques similar to those used for conventional planar MOSFETs.

SUMMARY OF THE INVENTION

Implementations consistent with the present invention provide a double-gate MOSFET that includes a metal gate that controls a strained channel.

One aspect of the invention is directed to a method of manufacturing a semiconductor device. The method includes forming a fin structure on an insulator, forming a dummy gate structure over at least a portion of the fin structure and a portion of the insulator, and forming sidewall spacers adjacent first and second sides of the dummy gate structure. The method further includes removing the dummy gate structure to create a space previously occupied by the dummy gate structure and depositing a metal layer at a high temperature in the space. The metal layer forms a gate for the semiconductor device. Cooling of the metal layer after deposition of the metal layer induces strain to the fin structure.

Another method consistent with aspects of the invention for manufacturing a semiconductor device includes forming a fin structure on an insulator, forming first and second sidewall spacers on the fin structures to create a space between the first and second sidewall spacers, and forming a metal layer at a temperature between about 600° to about 700° C. in the space between the first and second sidewall spacers. The metal layer forms a gate for the semiconductor device. Cooling of the metal layer induces strain to the fin structure that affects the mobility of the fin structure.

BRIEF DESCRIPTION OF THE DRAWINGS

Reference is made to the attached drawings, wherein elements having the same reference number designation may represent like elements throughout.

FIG. 2A schematically illustrates the top view of a fin structure in accordance with an exemplary embodiment of the present invention;

FIG. 2B is a cross-section taken along the line A–A' in FIG. 2A;

FIG. 6 is a cross-section similar to FIG. 5 and further illustrating planarization of the surrounding layer in accordance with an exemplary embodiment of the present invention;

FIG. 7 is a cross-section similar to FIG. 6 after removal of a nitride cap and a polysilicon layer in accordance with an exemplary embodiment of the present invention;

FIG. 8A is a cross-section similar to FIG. 7 and further illustrating formation of a metal gate layer in accordance with an exemplary embodiment of the present invention;

FIG. 8B schematically illustrates the top view of the semiconductor device shown in FIG. 8A;

FIGS. 9B–D are cross-sections illustrating further stages in the formation of the semiconductor device shown in FIG. 9A.

BEST MODE FOR CARRYING OUT THE INVENTION

The following detailed description of the invention refers to the accompanying drawings. The same reference numbers may be used in different drawings to identify the same or similar elements. Also, the following detailed description does not limit the invention. Instead, the scope of the invention is defined by the appended claims and their equivalents.

A FinFET, as the term is used herein, refers to a type of MOSFET in which a conducting channel is formed in a vertical silicon (Si) "fin." FinFETs are generally known in the art.

Implementations consistent with the present invention provide FinFET devices and methods of manufacturing such devices. The gates in the FinFET devices formed in accordance with the present invention may include a metal. The metal gate may be deposited and polished at high temperatures (e.g., 600°–700° C.). The subsequent cooling of the high temperature metal gate induces strain into the fin structure, leading to enhanced mobility.

Figure 1:
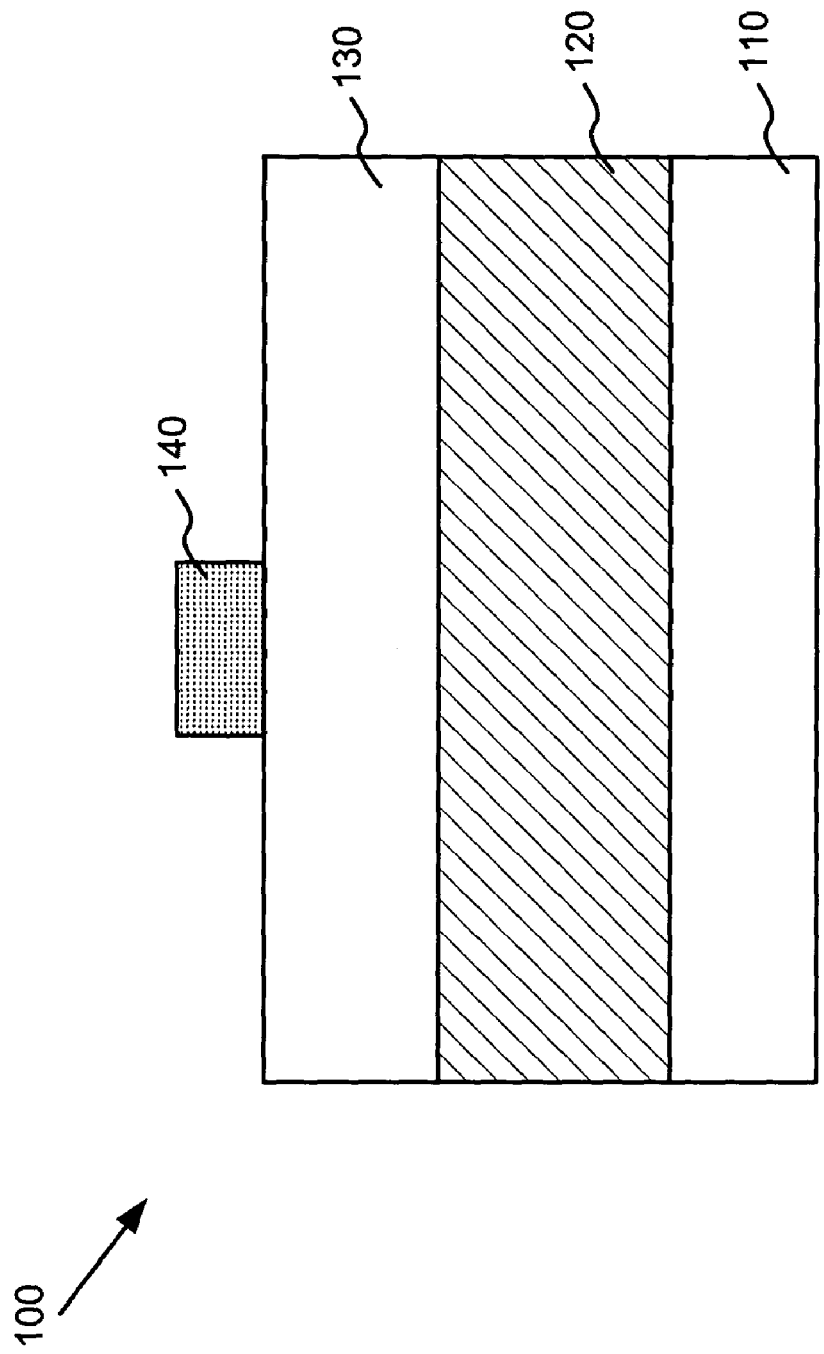
FIG. 1 is a cross-section illustrating exemplary layers that may be used for forming a fin in accordance with an embodiment of the present invention.

FIG. 1 illustrates a cross-section of a semiconductor device 100 formed in accordance with an embodiment of the present invention. Referring to FIG. 1, semiconductor device 100 may include a silicon on insulator (SOI) structure that includes a silicon substrate 110, a buried oxide layer 120, and a silicon layer 130 formed on the buried oxide layer 120. Buried oxide layer 120 and silicon layer 130 may be formed on substrate 110 in a conventional manner.

In an exemplary implementation, buried oxide layer 120 may include a silicon oxide and may have a thickness ranging from about 1000 Å to about 3000 Å. Silicon layer 130 may include monocrystalline or polycrystalline silicon having a thickness ranging from about 300 Å to about 1500 Å. Silicon layer 130 is used to form a fin structure for a double-gate transistor device, as described in more detail below.

In alternative implementations consistent with the present invention, substrate 110 and layer 130 may include other semiconducting materials, such as germanium, or combinations of semiconducting materials, such as silicon-germanium. Buried oxide layer 120 may also include other dielectric materials.

Next, a photoresist material may be deposited and patterned to form a photoresist mask 140 for subsequent processing. The photoresist material may be deposited and patterned in any conventional manner. Semiconductor device 100 may then be etched. In an exemplary implementation, silicon layer 130 may be etched in a conventional manner, with the etching terminating on buried oxide layer 120 to form a fin. Photoresist mask 140 may then be removed. After the formation of the fin, source and drain regions may be formed (e.g., by deposition or epitaxial growth of a semiconducting material) adjacent the respective ends of the fin. For example, in an exemplary embodiment, a layer of silicon, germanium or combination of silicon and germanium may be deposited, patterned and etched in a conventional manner to form source and drain regions. Alternately, the source and drain regions may be formed in the same photolithography process that forms the fin.

FIG. 2A schematically illustrates the top view of a semiconductor device formed in the manner described above. Fin 210 was formed from silicon layer 130. Source region 220 and drain region 230 may be formed adjacent the ends of fin 210 on buried oxide layer 120, according to an exemplary embodiment of the present invention.

FIG. 2B is a cross-section along line A–A' in FIG. 2A illustrating fin 210. In an exemplary implementation, the width of fin 210 may range from about 50 Å to about 500 Å.

Figure 3A:
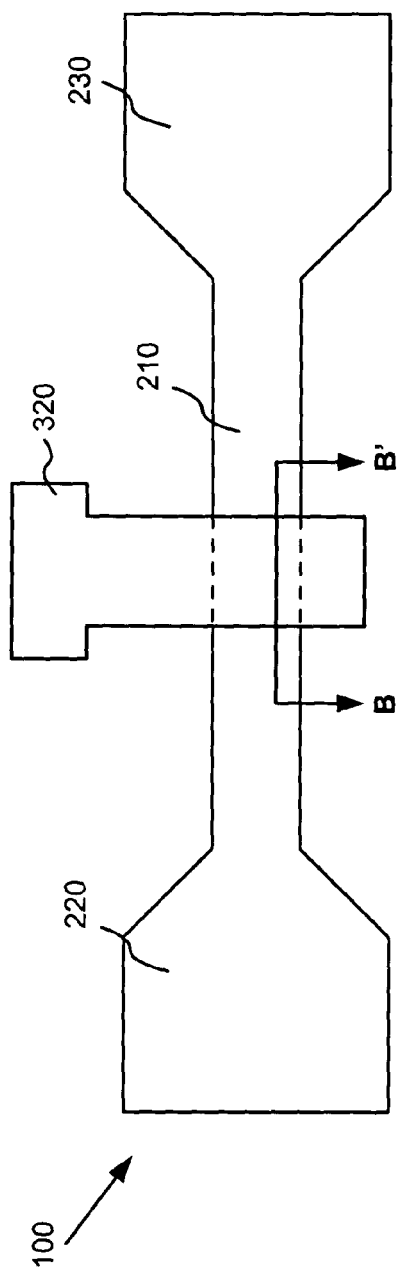
FIG. 3A schematically illustrates the top view of a semiconductor device in accordance with an exemplary embodiment of the present invention.

A dummy gate structure may next be deposited, patterned, and etched on semiconductor device 100. FIG. 3A is top view illustrating a dummy gate structure 320 that extends over a channel area of fin 210.

Figure 3B:
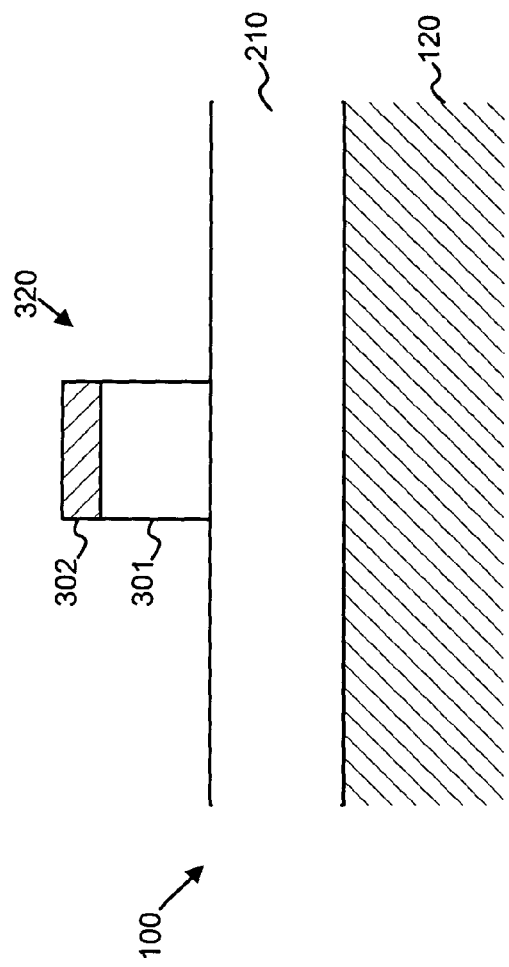
FIG. 3B is a cross-section taken along the line B–B' in FIG. 3A.

FIG. 3B is a cross-section taken along the line B–B' in FIG. 3A. As shown in FIG. 3B, dummy gate structure 320 may be formed from a polysilicon layer 301 and a nitride cap layer 302. Polysilicon layer 301 may be deposited using conventional chemical vapor deposition (CVD) or other well known techniques. Nitride cap 302 is formed over polysilicon layer 301. A photoresist material (not shown) may then be deposited and the resultant structure etched to form dummy gate structure 320. In alternate implementations, dummy gate structure 320 may be formed simultaneously with the formation of fin 210 instead of in a separate stage after the formation of fin 210. In one implementation, polysilicon layer 301 may be formed to a thickness of about 200 Å to about 1000 Å. Nitride cap 302 may be formed to a thickness of about 100 Å to about 500 Å.

Figure 4:
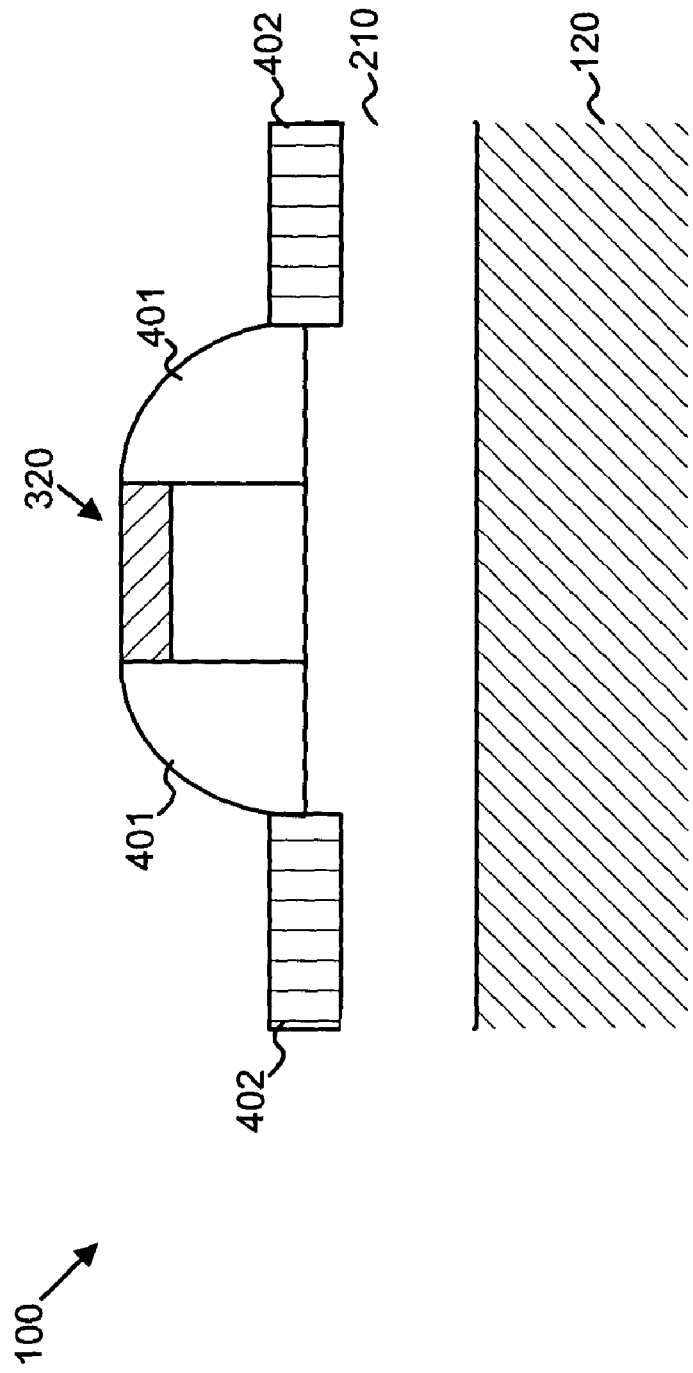
FIG. 4 is a cross-section similar to FIG. 3B and illustrating a formation of sidewall spacers accordance with an exemplary embodiment of the present invention.

FIG. 4 is a cross-section taken along the line B–B' in FIG. 3A illustrating a further stage in the formation of semiconductor device 100. A spacer material may be deposited adjacent dummy gate structure 320 and etched to form sidewall spacers 401. Sidewall spacers 401 may include, for example, an oxide material. A metal layer may next be deposited on semiconductor device 100. The metal layer may be, for example, tungsten, cobalt, nickel, titanium, tantalum, or molybdenum. The metal layer may then be thermally annealed to create a metal silicide compound in the exposed silicon areas of fin 210. FIG. 4 illustrates the resultant silicide material 402 after silicidation. Although not shown, silicide material may extend over source region 220 and drain region 230.

Figure 5:
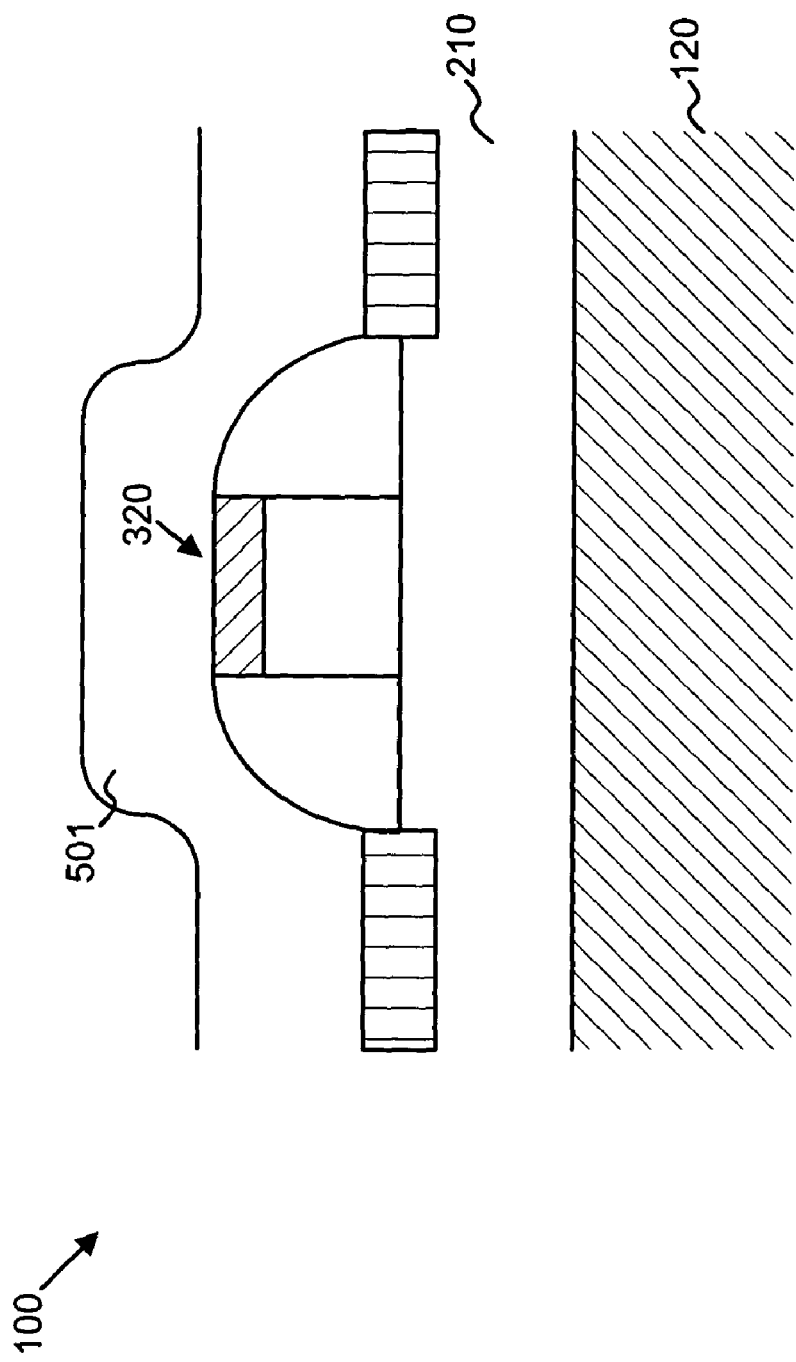
FIG. 5 is a cross-section similar to FIG. 4 and further illustrating the formation of a surrounding layer in accordance with an exemplary embodiment of the present invention.

FIG. 5 is a cross-section similar to that shown in FIG. 4 and illustrating a further stage in the formation of semiconductor device 100. As illustrated, a surrounding protective layer 501 may be deposited over semiconductor device 100. In one implementation consistent with the principles of the invention, surrounding layer 501 may include a dielectric material such as tetraethyl orthosilicate (TEOS), although other dielectric material may be used. Surrounding layer 501 may be deposited to a depth of about 200 Å to about 1000 Å.

As shown in FIG. 6, surrounding layer 501 may be planarized through a process such as via a chemical mechanical polish (CMP). CMP is a known planarization technique that may be used to planarize a semiconductor surface. In one implementation, CMP is performed down to nitride layer 302, which serves as a protective cap during the CMP process.

Layer 501 may be used as a protective layer for the removal of nitride cap 302 and polysilicon layer 301. In particular, semiconductor device 100 may be etched via a wet etch using a material that does not remove surrounding layer 501 or sidewall spacers 401, but that removes nitride cap 302 and polysilicon layer 301. FIG. 7 is a cross-section similar to that shown in FIG. 6 and further illustrating semiconductor device 100 after removal of nitride cap 302 and polysilicon layer 301.

FIG. 8A is a cross-section similar to that shown in FIG. 7 and illustrating a further stage in the formation of semiconductor device 100. A metal layer 803, such as, for example, tungsten, cobalt, nickel, titanium, tantalum, or molybdenum may be deposited on semiconductor device 100. Metal layer 803 fills in the space left by the removal of nitride cap 302 and polysilicon layer 301. Metal layer 803 may be deposited at a high temperature, such as about 600°–700° C. Metal layer 803 may then be planarized using a CMP process to the level of surrounding layer 501. The resultant version of semiconductor device 100, including the planarized metal layer 803, is shown in FIG. 8A. A top-view of FIG. 8A is shown in FIG. 8B. As shown, metal layer 803 has replaced dummy gate structure 310 as the gate for the semiconductor device.

As mentioned, metal layer 803 is deposited and planarized at a high temperature. As metal layer 803 cools, it will contract, which induces strain to fin 210. The strain may beneficially affect the mobility of the channel of the FinFET.

OTHER IMPLEMENTATIONS

Instead of forming a FinFET having a metal gate, such as metal layer 803, FinFETs with a polysilicon gate may be formed. FIGS. 9A–9D illustrate stages in the formation of such a FinFET.

Figure 9A:
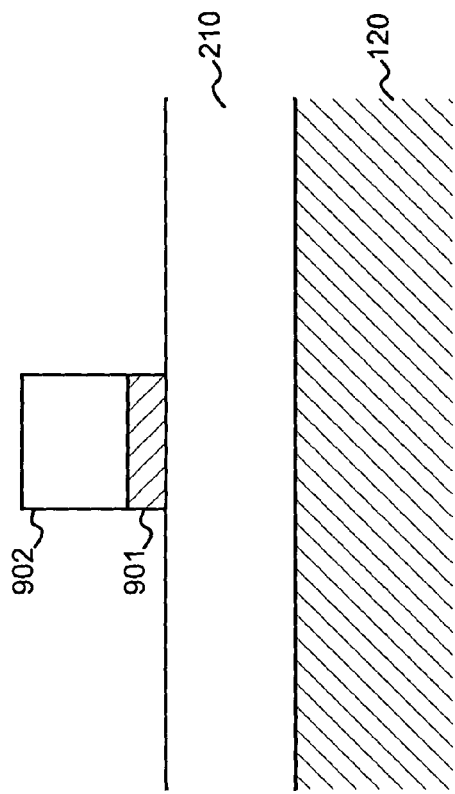
FIG. 9A is a cross-section illustrating an alternate implementation of a semiconductor device.

FIG. 9A is a cross-section such as a cross-section taken along the line B–B' in FIG. 3A. In this implementation, fin 210 includes dielectric layer 901, such as an oxide layer, and a polysilicon gate material layer 902.

Figure 9B:
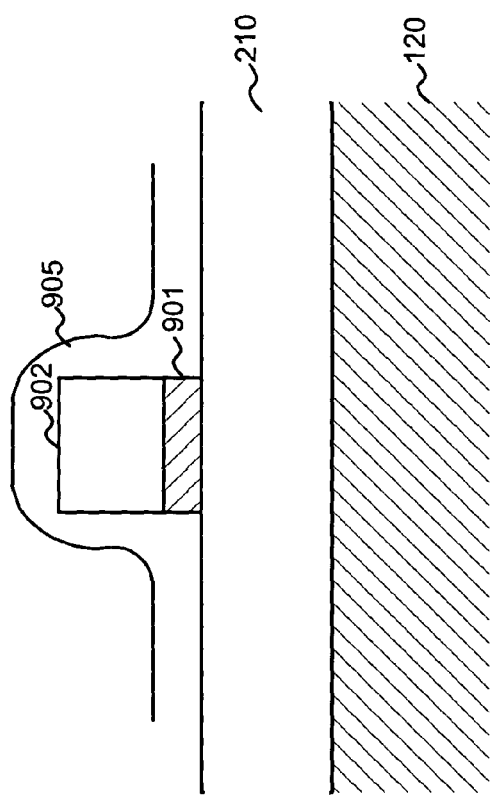

FIG. 9B is a cross-section illustrating a further stage in the formation of the semiconductor device shown in FIG. 9A. As shown, an SiON layer 905 is next formed around dielectric layer 901 and gate material layer 902. SiON layer 905 may alternatively be formed of other nitride-based materials. Layer 905 serves as a polish stop layer for a later planarization of the semiconductor device.

A TEOS layer 910 may then be formed over layer 905. This stage in the formation of the semiconductor device is shown in FIG. 9C. TEOS layer 910 may then be planarized through, for example, a high selectivity and high planarization TEOS CMP process. Layer 905 is used as a stop layer for the planarization of TEOS layer 901 (FIG. 9D).

CONCLUSION

The FinFET described above includes a metal gate that is formed at a high temperature. The cooling of the metal gate induces strain to the FinFET's fin, thus increasing mobility of the final device.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of chemical vapor deposition (CVD) processes, including low pressure chemical vapor deposition (LPCVD) and enhanced chemical vapor deposition (ECVD) can be employed.

The present invention is applicable in the manufacturing of semiconductor devices and particularly in semiconductor devices with design features of 100 nm and below, resulting in increased transistor and circuit speeds and improved reliability. The present invention is applicable to the formation of any of various types of semiconductor devices, and hence, details have not been set forth in order to avoid observing the thrust of the present invention. In practicing the present invention, conventional photolithographic and etching techniques are employed and, hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

The invention claimed is:

1. A method of manufacturing a FinFET semiconductor device, comprising:
   forming a fin structure of the FinFET on an insulator;
   forming a dummy gate structure over at least a portion of the fin structure and a portion of the insulator;
   forming sidewall spacers adjacent first and second sides of the dummy gate structure;
   removing the dummy gate structure to create a space previously occupied by the dummy gate structure; and
   depositing a metal layer at a high temperature in the space previously occupied by the dummy gate structure, the metal layer forming a gate for the semiconductor device, wherein
   cooling the metal layer after deposition of the metal layer induces strain to the fin structure.

2. The method of claim 1, wherein the strain induced to the fin structure changes the mobility of the semiconductor device.

3. The method of claim 1, wherein the high temperature is between about 600° to about 700° C.

4. The method of claim 1, wherein forming the dummy gate structure further includes:
   forming a polysilicon layer, and
   forming a nitride cap over the polysilicon layer.

5. The method of claim 1, further comprising:
   forming source and drain structures adjacent the fin structure.

6. The method of claim 1, wherein the sidewall spacers are formed from an oxide material.

7. The method of claim 1, further comprising:
   siliciding portions of the fin structure outside of an area covered by the sidewall spacers and the dummy gate structure.

8. The method of claim 7, further comprising:
   forming a surrounding protective layer over the semiconductor device after the siliciding of the portions of the fin structure.

9. The method of claim 8, further comprising:
   planarizing the surrounding protective layer to a level of the dummy gate structure.

10. A method of manufacturing a FinFET semiconductor device, comprising:
    forming a fin structure of the FinFET on an insulator;
    forming first and second sidewall spacers on the fin structures to create a space between the first and second sidewall spacers; and
    forming a metal layer at a temperature between about 600° to about 700° C. in the space between the first and second sidewall spacers, the metal layer forming a gate for the semiconductor device,
    wherein cooling of the metal layer after forming of the metal layer induces strain to the fin structure that affects the mobility of the fin structure.

11. The method of claim 10, wherein the sidewall spacers are formed from an oxide material.

12. The method of claim 10, further comprising:
    forming a dummy gate structure over at least a portion of the fin structure and a portion of the insulator,
    wherein the first and second sidewall spacers are formed on opposite sides of the dummy gate structure.

13. The method of claim 12, further comprising:
    removing the dummy gate structure to create the space between the first and second sidewall spacers.

14. The method of claim 12, wherein forming the dummy gate structure further includes:
   forming a polysilicon layer, and
   forming a nitride cap over the polysilicon layer.

15. The method of claim 12, further comprising:
   siliciding portions of the fin structure outside of an area covered by the sidewall spacers and the dummy gate structure.

16. The method of claim 15, further comprising:
   forming a surrounding protective layer over the semiconductor device after the siliciding of the portions of the fin structure.

17. The method of claim 16, further comprising:
   planarizing the surrounding protective layer to a level of the dummy gate structure.

18. A method of forming a double-gate MOSFET device, comprising:
   forming a fin structure on an insulator to act as a vertical conducting channel in the MOSFET device;
   forming a dummy gate structure over at least a portion of the fin structure and a portion of the insulator;
   forming sidewall spacers adjacent first and second sides of the dummy gate structure;
   siliciding portions of the fin structure outside of an area covered by the sidewall spacers and the dummy gate structure;
   forming a surrounding protective layer over the semiconductor device;
   planarizing the surrounding protective layer to a level of the dummy gate structure;
   removing the dummy gate structure to create a space previously occupied by the dummy gate structure; and
   depositing a metal layer at a temperature between about 600° to about 700° C. in the space previously occupied by the dummy gate structure, the metal layer forming a gate for the semiconductor device, wherein
   cooling the metal layer after deposition of the metal layer induces strain to the fin structure that affects the mobility of the double-gate MOSFET.

19. The method of claim 18, wherein forming the dummy gate structure further includes:
   forming a polysilicon layer, and
   forming a nitride cap over the polysilicon layer.

20. The method of claim 18, wherein the sidewall spacers are formed from an oxide material.

* * * * *